United States Patent
Kirscht et al.

(10) Patent No.: US 6,491,752 B1
(45) Date of Patent: Dec. 10, 2002

(54) ENHANCED N-TYPE SILICON MATERIAL FOR EPITAXIAL WAFER SUBSTRATE AND METHOD OF MAKING SAME

(75) Inventors: Fritz G. Kirscht, Salem, OR (US); Peter D. Wildes, West Linn, OR (US); Volker R. Todt, Corvallis, OR (US); Nobuo Fukuto, Salem, OR (US); Boris A. Snegirev, Woodburn, OR (US); Seung-Bae Kim, Salem, OR (US)

(73) Assignee: SUMCO Oregon Corporation, Salem, OR (US)

( * ) Notice: Subject to any disclaimer, the term of this patent is extended or adjusted under 35 U.S.C. 154(b) by 0 days.

(21) Appl. No.: 09/354,994

(22) Filed: Jul. 16, 1999

(51) Int. Cl.[7] ............................................. H01L 21/228
(52) U.S. Cl. ......................................... 117/21; 438/510
(58) Field of Search ............................ 117/21; 438/510; 257/592

(56) References Cited

U.S. PATENT DOCUMENTS

| | | | |
|---|---|---|---|
| 3,615,261 A | * 10/1971 | Causey et al. | |
| 3,866,142 A | * 2/1975 | Cline et al. | |
| 3,976,508 A | * 8/1976 | Mlasvsky | |
| 4,134,785 A | * 1/1979 | Lavigna et al. | |
| 4,220,483 A | 9/1980 | Cazcarra | 148/1.5 |
| 4,231,809 A | 11/1980 | Schmidt | 148/1.5 |

(List continued on next page.)

FOREIGN PATENT DOCUMENTS

| | | | |
|---|---|---|---|
| EP | 0 137 209 | 8/1984 | ........... C03B/15/00 |
| EP | 0 137 209 A2 | 4/1985 | |
| EP | 0 191 111 A1 | 8/1986 | |
| EP | 0 435 440 A1 | 7/1991 | |

OTHER PUBLICATIONS

Increasing Carbon Content in Czochralski Grown Crystals, Aug. 1, 1982, IBM Technical Disclosure Bulletin, vol. 25, pp. 962–963.*
"Study on the Oxygen Concentration Reduction in Heavily Sb–Doped Silicon", Liu, et al. Journal of Crystal Growth, 1999, vol. 196 pp. 111–114.
"Oxygen Precipitation in Silicon", Borghesi, et al. Journal of Applied Physics, May 1, 1995, vol. 77, pp. 4169–4244.
McHugo, "A study of gettering efficiency and stability in Czochralski silicon" (May 2, 1995; 320 Applied Physics Letter #66; pp. 2840–2842).
Wijaranakula et al. "A formation of crystal defects in carbon–doped Czochralski–grown silicon after a 3–step internal gettering anneal" (J. Electrochemical Soc., Jul. 1991, No. 7, pp. 2153–2159).

*Primary Examiner*—George Fourson
*Assistant Examiner*—Joannie Adelle Garcia
(74) *Attorney, Agent, or Firm*—Marger Johnson & McCollom, P.C.

(57) ABSTRACT

An enhanced $n^+$ silicon material for epitaxial substrates and a method for producing it are described. The enhanced material leads to improved gettering characteristics of $n/n^+$ epitaxial wafers based on these substrates. The method for preparing such $n^+$ silicon material includes applying a co-doping of carbon to the usual n dopant in the silicon melt, before growing respective CZ crystals. This improves yield of enhanced $n^+$ silicon material in crystal growing and ultimately leads to device yield stabilization or improvement when such $n/n^+$ epitaxial wafers are applied in device manufacturing.

6 Claims, 3 Drawing Sheets

U.S. PATENT DOCUMENTS

| | | | |
|---|---|---|---|
| 4,330,362 A | * 5/1982 | Zulehner | |
| 4,415,401 A | * 11/1983 | Wald et al. | |
| 4,591,409 A | 5/1986 | Ziem et al. | 156/605 |
| 4,659,423 A | 4/1987 | Kim et al. | 156/617 SP |
| 4,705,591 A | 11/1987 | Carle et al. | 156/617 SP |
| 4,910,156 A | 3/1990 | Takasu et al. | 437/17 |
| 4,927,489 A | * 5/1990 | Campbell et al. | |
| 5,041,186 A | * 8/1991 | Nishio et al. | |
| 5,110,404 A | 5/1992 | Fusegawa et al. | 156/603 |
| 5,186,784 A | 2/1993 | Rau et al. | 156/605 |
| 5,259,916 A | 11/1993 | Rau et al. | 156/605 |
| 5,394,829 A | 3/1995 | Uesugi et al. | 117/217 |
| 5,419,277 A | * 5/1995 | Urano et al. | |
| 5,476,065 A | 12/1995 | Ikezawa et al. | 117/217 |
| 5,573,591 A | 11/1996 | Ikezawa et al. | 117/20 |
| 5,641,353 A | 6/1997 | Hara et al. | 117/3 |
| 5,900,055 A | * 5/1999 | Nagai et al. | |
| 6,059,875 A | * 5/2000 | Kirkland et al. | |
| 6,214,109 B1 | * 4/2001 | Holder | |

* cited by examiner

ENHANCED N-TYPE SILICON MATERIAL FOR EPITAXIAL WAFER SUBSTRATE AND METHOD OF MAKING SAME

FIELD OF THE INVENTION

This invention relates generally to the field of preparing silicon substrate wafers for use in the formation of semiconductor devices such as power discrete or power integrated circuits.

BACKGROUND OF THE INVENTION

Semiconductor devices are built either into polished or epitaxial silicon wafers. The latter consists of an epitaxial (epi) layer on top of a polished wafer substrate. Epi layers typically contain low concentrations of electrically active dopants, usually phosphorous (n-type conductivity) or boron (p-type conductivity), typically close to $10^{15}$ atoms $cm^{-3}$. Substrates in many cases contain high concentrations of dopant atoms, which may be phosphorous, antimony, or arsenic (n-type) or boron (p-type), typically in the range $10^{18}$–$10^{19}$ atoms $cm^{-3}$. Dopant levels close to the solubility limit for respective dopant species are needed to lower the resistivity of epi wafer substrates, an important requirement for state-of-the-art power device applications. Silicon material containing such high levels of n-dopant is generally called $n^+$ material. Such material, cut in slices from respective $n^+$ crystals, is used for preparing $n^+$ substrates for ultimate $n/n^+$ epi wafers.

Oxygen is incorporated into growing crystals applying the Czochralski (CZ) technique through dissolution of the fused silica or quartz ($SiO_2$) crucibles used for holding the silicon melt. The molten silicon reacts with the $SiO_2$ crucible wall to form SiO. Some of the SiO evaporates from the melt at the temperature and pressure commonly used for silicon crystal growth. However, some remains in the melt and may be incorporated into the growing crystal. As the melt is solidified, the contact area between the melt and the crucible wall decreases while the area of melt surface available for evaporation of SiO remains substantially constant until near the end of the crystal growth. Consequently, the concentration of oxygen in the melt and therefore the concentration incorporated into the crystal tends to decrease with increasing distance from the seed end of the crystal. Without any countermeasures, this leads to an axial oxygen profile which typically displays decreasing oxygen concentration toward the tail-end of the crystal. The presence of high concentrations of n-type dopants in the silicon melt enhances evaporation of SiO during crystal growing and thereby further reduces the amount of oxygen incorporated into a growing $n^+$ crystal, leading to an axial oxygen profile decreasing heavily toward the tail-end of such a crystal. Without any state-of-the-art countermeasures, after reaching a certain percentage of the total length of such a CZ $n^+$ crystal, the oxygen concentration typically drops below the level required to generate adequate oxygen precipitation when such material is later processed in thermal device manufacturing steps. The length of the crystal at which the oxygen level drops below that required for adequate oxygen precipitation is called the critical crystal length abbreviated $L_c$.

Oxygen precipitation in epi wafer substrates is the prerequisite for internal gettering (IG) typically applied for controlling the degradation of device yield by way of heavy metal contamination during the thermal device manufacturing steps. Such degradation is described in an article by A. Borghesi, B. Pivac, A. Sassella and A. Stella entitled Oxygen Precipitation in Silicon, published in the Journal of Applied Physics, Vol. 77, No. 9, May 1, 1995, pp. 4169–4244, at 4206–07. Effective IG has been observed at oxygen precipitation related bulk defect densities in the order of $10^9$ atoms $cm^{-3}$. This bulk defect density is critical for effective IG and is referred to hereinafter as the critical defect number $N_c$. Epitaxial $n/n^+$ wafers based on such high defect density $n^+$ substrates exhibit superior IG related leakage resistance and thereby potentially improved device yield. Thermally induced oxygen precipitation during device processing is suppressed in the case of n-type dopant atoms in epi wafer substrates which creates the necessity to introduce large quantities of oxygen into a crystal. It has been determined experimentally by the inventors hereof that CZ crystals with arsenic concentrations in the order to $10^{19}$ atoms $cm^{-3}$ need approximately $8 \times 10^{17}$ atoms $cm^{-3}$ oxygen (ASTM 121-83 calibration) in order to reach the $N_c$ necessary for effective IG. Without any state of the art countermeasures, $L_c$ is less than 10% of the total crystal length in this case. In order to essentially increase $L_c$, effort heretofore has been generally directed at reducing the axial variation of oxygen incorporation. Currently used techniques aiming at axially homogenizing the oxygen level include adjusting crystal pull speed and utilizing crystal and crucible rotation, all in conjunction with controlling gas flow and pressure in the puller chamber. Another technique is the application of defined magnetic fields during crystal growth. These countermeasures are technically sophisticated and/or associated with high cost.

The presence of carbon in silicon wafers has long been known to enhance the precipitation of oxygen. For example, Ahlgren et al. European Application No. 84109528.4 at page 7, lines 26 to 33 teaches that silicon with carbon concentration in excess of 4 ppma ($2 \times 10^{17}$ atoms $cm^{-3}$) (ASTM 123-76 calibration) can induce substantial oxygen precipitation in silicon containing less than 28 ppma ($1.4 \times 10^{18}$ atoms $cm^{-3}$) oxygen (ASTM 121-79 calibration) after a thermal treatment that would induce negligible oxygen precipitation at lower concentrations of carbon. It appears that that work refers to the addition of carbon by the usual means as set forth above. Thus, the work accepts the carbon which is introduced as a necessary "evil" in consequence of the available equipment used in 1984 and sampling the carbon content along the length of the grown crystal to determine what portion can be advantageously used. Such carbon introduction is uncontrolled and mainly due to the graphite parts used in the puller construction. In current state of the art crystal pullers it is possible to maintain carbon at levels below $5 \times 10^{15}$ atoms $cm^{-3}$ in spite of the use of graphite heaters and insulation. Moreover, the European application makes no mention of the presence of n-type or p-type doping materials and it is directed to lightly doped silicon crystals for substrates.

Developments aimed at reducing carbon contamination in crystal growth were originally driven by experimental evidence of detrimental device impact of carbon if present in certain concentration levels within critical device regions of wafers. In the case of epi wafer substrates it is highly unlikely that carbon would enter a critical device regions (typically located in epi layers deposited on top of a substrate) because carbon is a slow diffuser in silicon. Even so, current epi wafer specifications typically still call for carbon concentrations below $10^{16}$ atoms $cm^{-3}$.

SUMMARY OF THE INVENTION

The present invention is directed to a process for growing silicon crystals wherein predetermined amounts of carbon are added in a controlled fashion to produce the level of oxygen precipitation desired. This process can be effective in $n^+$ doped silicon epi substrates at carbon levels significantly lower than $2\times10^{17}$ atoms $cm^{-3}$. Rapidly increasing carbon concentration is observed only toward the tail-end of carbon co-doped crystals because its incorporation into the crystal is controlled by the segregation behavior.

Such carbon doping of CZ silicon at a very low concentration can strongly increase the oxygen precipitation in heavily n-doped materials. Moreover, there is a relationship between co-doped carbon, oxygen concentration and bulk defect density after annealing, enabling predetermination of the amount of carbon to be added to achieve the bulk defect level necessary for effective internal gettering. The established methodology allows development of simple and low-cost crystal growing processes leading to enhanced n-type silicon material for epitaxial wafer substrates.

BRIEF DESCRIPTION OF THE DRAWINGS

Additional objects and features of the invention will be more readily apparent from the following detailed description and appended claims when taken in conjunction with the drawing, in which:

DESCRIPTION OF THE PREFERRED EMBODIMENT

Figure 1:
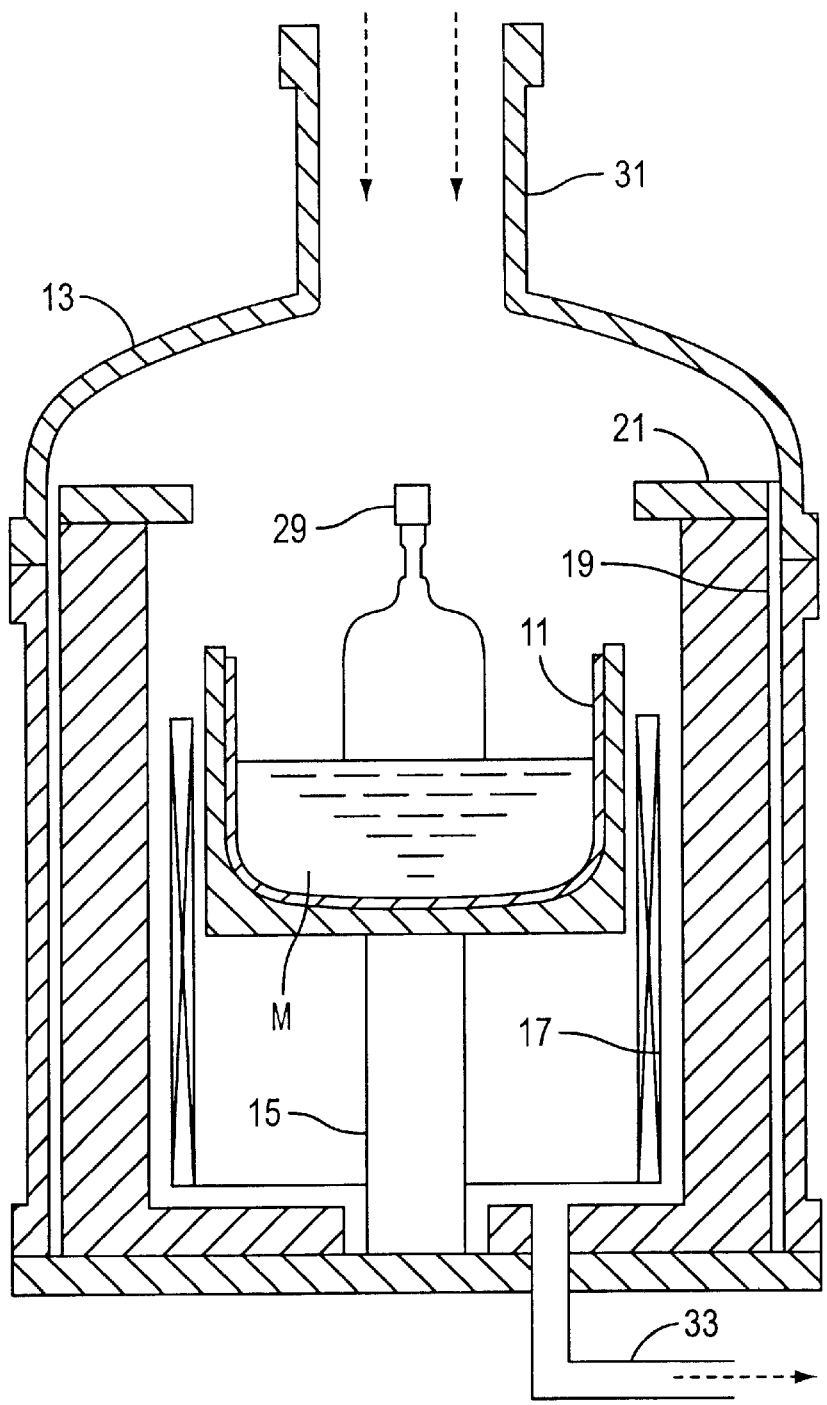
FIG. 1 is a lateral sectional view of a pulling apparatus using the Czolchralski technique suitable for use with the present invention.

FIG. 1 shows one of several forms of a pulling apparatus using the Czolchralski technique suitable for use with the invention. A quartz crucible 11 is positioned inside a pulling chamber 13. The quartz crucible 11 is attached to a rotatable bottom shaft 15. A heater 17 is provided around the quartz crucible 11 for heating and controlling the temperature of a melt M in the quartz crucible 11. The melt is primarily silicon but includes dopants. A heat retaining tube 19 is provided between the heater 17 and the pulling chamber 13. An annular supporting member 21 is attached at the top surface of the heat retaining tube 19.

To produce a silicon monocrystal by the CZ technique, polycrystalline silicon and the desired dopant(s), for example, P, B, Sb or As, are placed in the quartz crucible 11. A seed crystal is attached to and supported by a bracket 29 on a pulling shaft. The pulling chamber 13 is evacuated to a vacuum, and the heater 17 melts the polycrystalline silicon and the dopant(s). An inert carrier gas, such as argon, is passed through an inlet 31 into the pulling chamber 13 around the quartz crucible 11 and out the discharge 33. At the same time, the seed crystal is immersed in the melt in the quartz crucible 11. The pulling shaft then withdraws the seed crystal at a predetermined speed while rotating relative to the quartz crucible 11.

Figure 2:
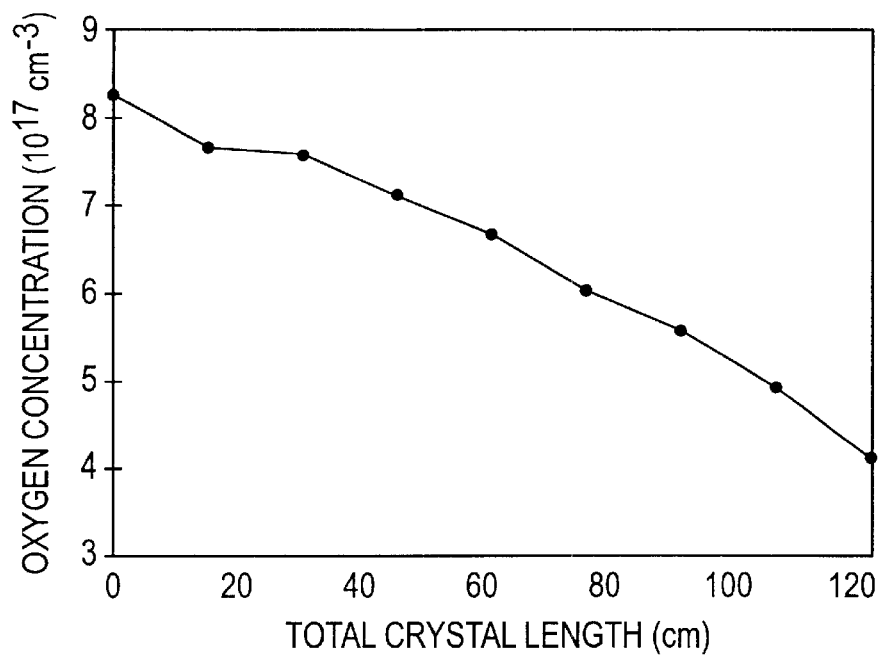
FIG. 2 is a graph showing the axial distribution of oxygen concentration along the length of a heavily arsenic doped crystal co-doped with carbon in accordance with the invention.
Figure 3:
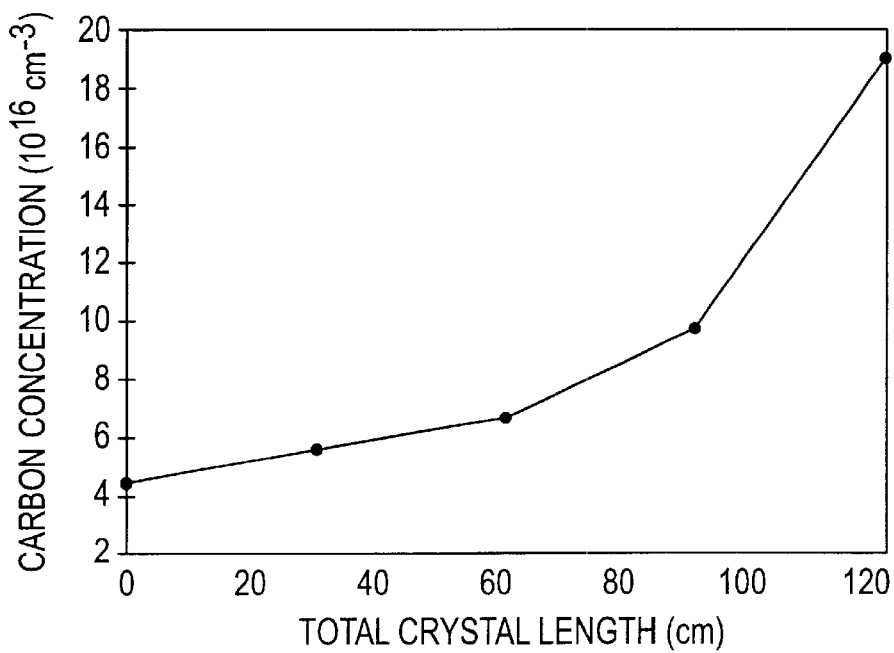
FIG. 3 is a graph similar to FIG. 2 but showing the axial distribution of carbon concentration along the length of a heavily arsenic doped crystal co-doped with carbon in accordance with the invention.

FIGS. 2 and 3 show axial distributions of oxygen and carbon concentration in a 100 mm diameter silicon crystal doped with arsenic in the order of $10^{19}$ atoms $cm^{-3}$. Before growing this crystal, 150 mg carbon were initially added to the molten silicon charge of 30 kg. The inverse concentration characteristics of oxygen and carbon are evident from the two graphs. Carbon co-doped $n^+$ crystals, even without employing means to maintain high oxygen incorporation throughout the crystal length, yield significantly higher in terms of potentially high-defect-density material needed for manufacturing $n^+$ substrates for ultimately producing leakage-resistant $n/n^+$ epitaxial wafers.

Figure 4:
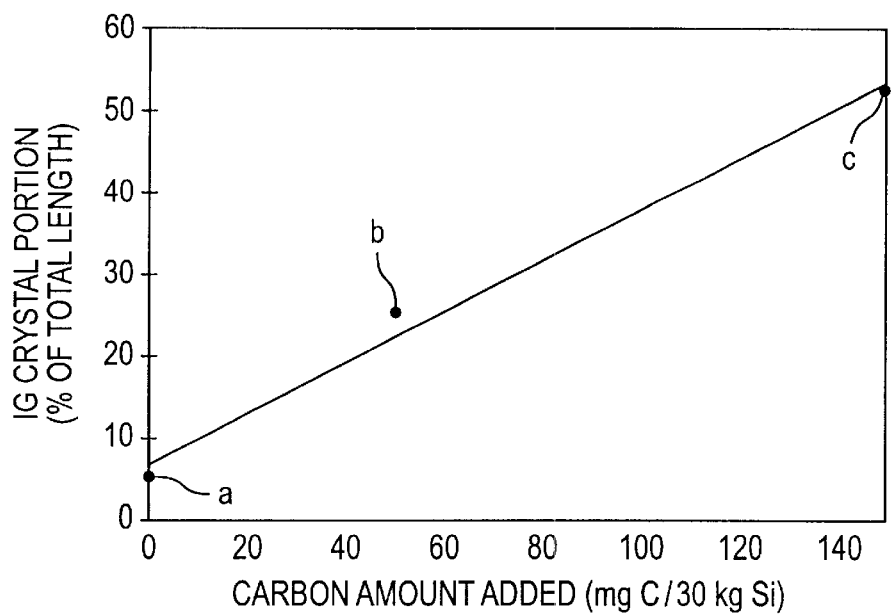
FIG. 4 is a graph showing percentage of the grown crystal suitable for internal gettering as a function of the amount of carbon added to the melt.

FIG. 4 shows the crystal yield increase as a function of carbon added to the silicon melt. From FIG. 4 it is obvious that there is established a simple method for determining the amount of carbon which must be added to the initial molten silicon charge to achieve a desired minimum level of bulk defect density over a defined portion or the entire length of the crystal grown from said charge employing standard growing technique and by applying a defined wafer annealing procedure. As an example, in laboratory tests, it was found that substrate material with arsenic concentrations in the order of $10^{19}$ atoms $cm^{-3}$ reaches the $N_c$ limit (for effective internal gettering) at an oxygen concentration of approximately $7.5\times10^{17}$ atoms $cm^{-3}$ if only light carbon doping of $1.9\times10^{16}$ atoms $cm^{-3}$ is applied. This is a substantial improvement over the $8.0\times10^{17}$ atoms $cm^{-3}$ oxygen needed with the typical state of the art carbon concentration level$<10^{16}$ atoms $cm^{-3}$. Oxygen can be further reduced to $6.25\times10^{17}$ atoms $cm^{-3}$ if the carbon concentration at the seed end of the crystal is increased to $4.3\times10^{16}$ atoms $cm^{-3}$. Consequently, in carbon-doped crystals there is no, or an extremely reduced, need to increase $L_c$ by reducing the axial oxygen variation (increasing the oxygen concentration toward the crystal tail).

Figure 5:
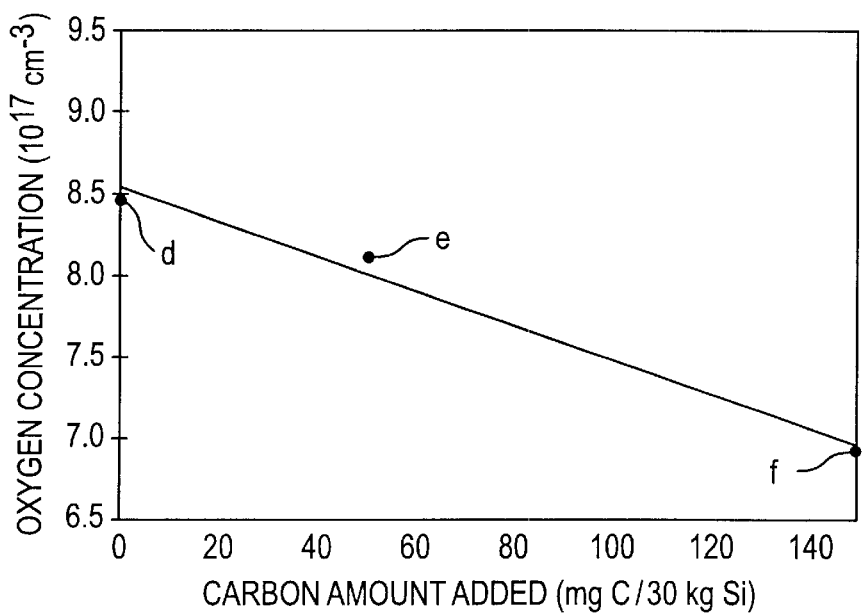
FIG. 5 is a graph showing the required oxygen concentration for internal gettering as a function the amount of carbon added to the melt.

Upon review of the graph shown in FIG. 5 it is seen that there is established a simple method to estimate the oxygen concentration needed over a range of carbon co-doping levels. The data points "a", "b" and "c" in FIG. 4 and corresponding data points "d", "e" and "f" in FIG. 5 were derived from tests comparing three heavily arsenic-doped crystals of 100 mm diameter. The arsenic concentration in these crystals was targeted to increase from $1.8\times10^{19}$ atoms $cm^{-3}$ (crystal seed) to $3.8\times10^{19}$ atoms $cm^{-3}$ (crystal tail). The corresponding amount of arsenic dopant was added to 30 kg charges of poly-silicon after melting the silicon charge. The first crystal was grown without intentionally adding carbon (data points "a" and "d" respectively in FIGS. 4 and 5). The second crystal was grown after adding only 50 mg high-purity carbon to the melt (data points "b" and "e" respectively in FIGS. 4 and 5), and for the third crystal 150 mg high-purity carbon was added (data points "c" and "f" respectively in FIGS. 4 and 5). No additional countermeasures for homogenizing the axial oxygen profile were applied. As a result, the three crystals with varying carbon levels have a comparable axial oxygen profile: the oxygen concentration falls from $8.3\times10^{17}$ atoms $cm^{-3}$ at the crystal seed to $4.0\times10^{17}$ atoms $cm^3$ at the crystal tail.

Summarizing, critical bulk defect density levels, needed for effective internal gettering in substrates for epitaxial wafers, can be reached at significantly lower oxygen levels in respective crystal material, as compared to material without carbon doping. Applying precipitation testing on wafers from these crystals (evaluation of $N_c$ as a function of crystal location), it was found that carbon co-doping clearly increases the critical crystal length with oxygen precipitation characteristics needed for effective internal gettering ($N_c > 10^9$ atoms cm$^{-3}$). There is a nearly linear increase of the high-precipitation portion of these crystals with carbon co-doping (FIG. 4). For example, more than 50% of the total length of a crystal exceeds $L_c$ when 150 mg of carbon is added to the initial 30 kg charge of silicon. The oxygen concentration necessary to generate effective internal gettering is coupled with the added carbon in a well-defined manner (FIG. 5). This means carbon co-doping can be applied for oxygen precipitation control in n$^+$ material used for epi wafer substrates, instead of sophisticated and/or expensive measures to increase and axially homogenize the oxygen concentration in such crystals.

What is claimed is:

1. A method for preparing n$^+$ silicon material comprising the steps of:

applying a dopant of antimony or arsenic to silicon melt in an amount sufficient to produce an n$^+$ doping concentration of at least $10^{18}$ atoms cm$^{-3}$;

applying a co-dopant of carbon to the silicon melt in an amount effective to promote oxygen precipitation in the silicon material in the presence of said n$^+$ doping concentration; and applying a seed crystal to said melt and growing a crystal therefrom by withdrawing the seed in the Czochralski technique.

2. A method for preparing n$^+$ silicon material as defined in claim 1 wherein said dopant of arsenic produces an n-type doping concentration of at least $10^{19}$ atoms cm$^{-3}$.

3. A method for preparing n$^+$ silicon material as defined in claim 1 wherein said dopant of antimony produces an n-type doping concentration of at least $10^{18}$ atoms cm$^{-3}$.

4. A method for preparing n$^+$ silicon material comprising the steps of:

applying a dopant of As or Sb to silicon melt in an amount sufficient to produce an n$^+$ doping concentration of at least $10^{-18}$ atoms cm$^{-3}$;

applying a co-dopant of carbon to the silicon melt; and applying a seed crystal to said melt and growing a crystal therefrom by withdrawing the seed in the Czochralski technique;

the co-dopant of carbon being applied in an amount sufficient to produce a carbon concentration of at least $1.9 \times 10^{16}$ atoms cm$^{-3}$.

5. A method for preparing n$^+$ silicon material comprising the steps of:

applying a dopant of As or Sb to silicon melt in an amount sufficient to produce an n$^+$ doping concentration of at least $10^{-18}$ atoms cm$^{-3}$;

applying a co-dopant of carbon to the silicon melt; and applying a seed crystal to said melt and growing a crystal therefrom by withdrawing the seed in the Czochralski technique;

the co-dopant of carbon being applied in a concentration sufficient in the presence of said n$^+$ doping concentration to produce oxygen-precipitation-related bulk defects in the material of at least $10^9$ defects cm$^{-3}$.

6. A method for preparing n$^+$ silicon material comprising the steps of:

applying a dopant of As or Sb to silicon melt in an amount sufficient to produce an n$^+$ doping concentration of at least $10^{-18}$ atoms cm$^{-3}$;

applying a co-dopant of carbon to the silicon melt in an amount sufficient to produce a carbon concentration in the n$^+$ silicon material of at least $1.9 \times 10^6$ atoms cm$^{-3}$; and applying a seed crystal to said melt and growing a crystal therefrom by withdrawing the seed in the Czochralski technique;

slicing the crystal into wafers and manufacturing substrate wafers therefrom; and forming an epitaxial layer on a major surface of these substrate wafers, thereby providing an active device layer for active device layer formation decoupled from defects in the substrate wafer, the epitaxial layer having an n-type dopant concentration at least 3 orders of magnitude less than the n$^+$ doping concentration.

* * * * *

UNITED STATES PATENT AND TRADEMARK OFFICE
CERTIFICATE OF CORRECTION

PATENT NO. : 6,491,752 B1
DATED : December 10, 2002
INVENTOR(S) : Kirscht et al.

It is certified that error appears in the above-identified patent and that said Letters Patent is hereby corrected as shown below:

Column 4,
Line 58, "$cm^3$" should read -- $cm^{-3}$ --.

Column 5,
Line 36, "$10^{-18}$" should read -- $10^{18}$ --.

Column 6,
Line 8, "$10^{-18}$" should read -- $10^{18}$ --.
Line 21, "$10^{-18}$" should read -- $10^{18}$ --.

Signed and Sealed this

Seventh Day of October, 2003

JAMES E. ROGAN
*Director of the United States Patent and Trademark Office*